US012785250B2

(12) United States Patent
Mayfield et al.

(10) Patent No.: US 12,785,250 B2
(45) Date of Patent: Nov. 3, 2026

(54) ADVANCED HIGH FREQUENCY AESA ANTENNA CONNECTION METHOD

(71) Applicant: Rockwell Collins, Inc., Cedar Rapids, IA (US)

(72) Inventors: James B. Mayfield, Cedar Rapids, IA (US); Neal D. Mains, Marion, IA (US); Christopher G. Olson, Mesa, AZ (US); Russell C. Tawney, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 444 days.

(21) Appl. No.: 18/514,556

(22) Filed: Nov. 20, 2023

(65) Prior Publication Data

US 2025/0167154 A1 May 22, 2025

(51) Int. Cl.
*H01Q 1/22* (2006.01)
*H01Q 1/52* (2006.01)
(Continued)

(52) U.S. Cl.
CPC ............. *H01Q 1/2283* (2013.01); *H01Q 3/34* (2013.01); *H01Q 9/0407* (2013.01); *H10W 72/50* (2026.01); *H10W 74/117* (2026.01); *H01Q 1/523* (2013.01); *H01Q 21/065* (2013.01); *H10W 70/60* (2026.01)

(58) Field of Classification Search
CPC ............. H01Q 1/2283; H01Q 21/0025; H01Q 9/0414; H01Q 23/00; H01Q 1/243; H01Q 9/0407; H01Q 3/34; H01Q 1/523; H01Q 21/065; H10W 44/248; H10W 44/20; H10W 90/724; H10W 90/00; H10W 90/701; H10W 42/20; H10W 70/611; H10W 70/614; H10W 70/60; H10W 72/90; H10W 74/016; H10W 90/728;
(Continued)

(56) References Cited

U.S. PATENT DOCUMENTS 6,324,755 B1 * 12/2001 Borkowski .......... H05K 1/0207
29/830
8,570,237 B2 * 10/2013 Brown ..................... H01Q 5/42
343/907
(Continued)

FOREIGN PATENT DOCUMENTS

CA 2663800 C 11/2015
CA 3196948 A1 5/2022

OTHER PUBLICATIONS

European Search Report received in EP Application No. 24212523.5, Jul. 28, 2025, 17 pages.

*Primary Examiner* — Maliheh Malek
(74) *Attorney, Agent, or Firm* — Suiter Swantz IP

(57) ABSTRACT

An electronic package includes multiple separate circuit cards. An unbalanced, single circuit card is separated into multiple individual circuit cards with balanced stacks. The beamforming circuitry and antenna may be embodied in separate circuit cards. The beamforming circuitry and amplifiers may include pads for electronic connectivity on both a top surface and a bottom surface. Internal vias create electronic connectivity between the top surface and bottom surface. An antenna card may connect to the beamforming circuitry via pads on the top surface of the circuitry card.

16 Claims, 2 Drawing Sheets

(51) Int. Cl.

| | |
|---|---|
| ***H01Q 3/34*** | (2006.01) |
| ***H01Q 9/04*** | (2006.01) |
| ***H01Q 21/06*** | (2006.01) |
| ***H10W 72/50*** | (2026.01) |
| ***H10W 74/10*** | (2026.01) |
| *H10W 70/60* | (2026.01) |

(58) Field of Classification Search

CPC ............. H10W 90/734; H10W 90/754; H03H 1/0007; H01P 1/20

See application file for complete search history.

(56) References Cited

U.S. PATENT DOCUMENTS 8,981,869 B2 * 3/2015 Puzella .............. H01Q 21/0087 333/33
9,172,145 B2 * 10/2015 Puzella ...................... H01P 1/38
9,974,159 B2 * 5/2018 Puzella ................ H01R 12/523
10,694,637 B1 * 6/2020 Wolf ...................... H01Q 1/002
10,886,606 B2 * 1/2021 Kamgaing ........... H01Q 1/2283
11,064,602 B1 * 7/2021 Wolf ...................... H05K 3/368
11,183,756 B1 * 11/2021 Pond ..................... H04W 52/04
11,271,321 B1 * 3/2022 West ........................ H01Q 1/24
11,296,424 B2 * 4/2022 West ...................... H01Q 15/24
12,476,370 B2 * 11/2025 Kozyrev ................... H01P 1/20
12,555,919 B2 * 2/2026 Dalmia ................ H01Q 1/2283
2012/0280860 A1 * 11/2012 Kamgaing ........... H01Q 1/2283 29/601
2013/0027071 A1 * 1/2013 Canegallo .......... G01R 1/07314 324/754.21
2015/0015453 A1 * 1/2015 Puzella ..................... H01P 1/38 333/1.1
2017/0092602 A1 * 3/2017 Meyers ................. H10P 74/277
2017/0187133 A1 * 6/2017 Sepic ................... G01R 1/0466
2018/0315715 A1 * 11/2018 Chiu .................... H01Q 1/2283
2018/0323159 A1 * 11/2018 Kamgaing ............... H01Q 1/38
2020/0066621 A1 * 2/2020 Liu ..................... H10W 70/611
2020/0212537 A1 * 7/2020 Chuang ................ H01Q 1/2283
2020/0253040 A1 * 8/2020 Dalmia ................. G06F 1/1613
2020/0303291 A1 * 9/2020 Perez-Corona ....... H10P 74/273
2021/0225719 A1 * 7/2021 Seler .................... H01Q 1/2283
2021/0233865 A1 * 7/2021 Tarui ................... H10W 40/778
2021/0242896 A1 * 8/2021 Kim ..................... H01Q 1/2283
2021/0257736 A1 * 8/2021 Heo ..................... H01Q 1/2283
2021/0398922 A1 * 12/2021 Dogiamis ............. H01P 11/002
2022/0224382 A1 * 7/2022 Brunel ................... H04B 17/13
2023/0066814 A1 * 3/2023 Dalmia ................ H01Q 1/2283
2023/0290700 A1 * 9/2023 Chiang ................. H10W 44/20
2023/0420396 A1 * 12/2023 Acikalin .............. H01Q 1/2283
2024/0275041 A1 * 8/2024 Hou ....................... H01Q 1/246
2024/0421496 A1 * 12/2024 Suh ...................... H01Q 1/2266
2025/0015497 A1 * 1/2025 Kozyrev ................... H01P 1/20
2025/0118889 A1 * 4/2025 Cherkaoui ............. H01Q 1/288
2025/0167184 A1 * 5/2025 Mayfield ............... H10W 72/00
2025/0183550 A1 * 6/2025 Liston .................... H01Q 21/24
2025/0239754 A1 * 7/2025 Deuchst ................... H01Q 1/02
2026/0047456 A1 * 2/2026 Railkar ................. H10W 40/00

* cited by examiner

ADVANCED HIGH FREQUENCY AESA ANTENNA CONNECTION METHOD

BACKGROUND

For AESA radiating elements at high frequency (mmwave bands), the space available for necessary components is very small. The frequency of operation defines lattice spacing and thereby creates the available envelope. As frequencies trend higher, the available space continues to shrink. Despite space limitations, systems require power supply decoupling capacitance, precision calibrated resistors, and high capacitance for pulsed applications.

Electrical interconnects in a single printed circuit board traverse a significant path length through traces, and packaging that creates significant electrical loss. Furthermore, manufacturing processes make single printed circuit board solutions difficult. RF performance requires unbalanced printed circuit board stack-ups and unique material sets. Because of the differences in thermal expansion coefficients, these unbalanced stack-ups cause the printed circuit board to bow and twist; bowing and twisting causes assembly issues for large footprints and large BGA components resulting in low yields.

Complexity, (large number of processing steps for a single printed circuit board) increases production cost through yield loss. Damage at any process causes the entire card, including radio-frequency integrated circuits, to be replaced at significant cost.

SUMMARY

In one aspect, embodiments of the inventive concepts disclosed herein are directed to a package including multiple separate circuit cards. The package addresses the inherent imbalance associated with complex radiating structures by separating the overall imbalanced constructions into sub constructions comprised of significantly more balance. An unbalanced, single circuit card is separated into multiple individual circuit cards with balanced stacks. The beamforming circuitry, antenna, power distribution, and control circuitry may be embodied in separate circuit cards.

In a further aspect, the beamforming circuitry and amplifiers may include pads for electronic connectivity on both a top surface and a bottom surface. Internal vias create electronic connectivity between the top surface and bottom surface.

In a further aspect, an antenna card may connect to the beamforming circuitry via pads on the top surface of the circuit card.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
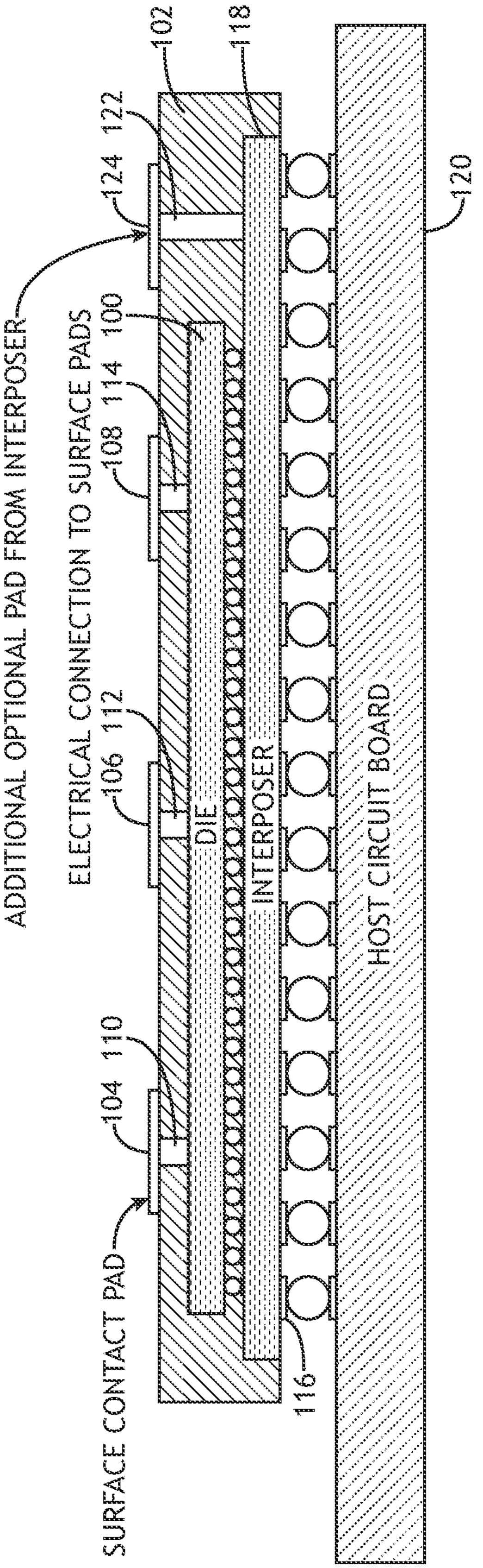
FIG. 1 shows a side view block diagram of a unit cell according to an exemplary embodiment.

Before explaining various embodiments of the inventive concepts disclosed herein in detail, it is to be understood that the inventive concepts are not limited in their application to the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of a feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Also, while various components may be depicted as being connected directly, direct connection is not a requirement. Components may be in data communication with intervening components that are not illustrated or described.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in at least one embodiment" in the specification does not necessarily refer to the same embodiment. Embodiments of the inventive concepts disclosed may include one or more of the features expressly described or inherently present herein, or any combination or sub-combination of two or more such features.

Broadly, embodiments of the inventive concepts disclosed herein are directed to a package including a die(s) and other electronic components and a plurality of pads disposed on a top surface of the package, connected to the die by vias. The die may be connected to an interposer through the overmold, wire bonds, solder joints or similar area array connections.

The interposer may be affixed to a host circuit board. Electronic components may be affixed to the top surface of the package and reflowed before or after the die is encapsulated.

The present disclosure enables microelectronics packaging to allow more efficient use of volume on an AESA assembly while minimizing the complexity of the PCBs that need to be designed.

Referring to FIG. 1, a side view block diagram of a unit cell according to an exemplary embodiment is shown. In at least one embodiment, a die 100 is contained within an over mold 102 of plastic or other inert material. The die 100 is in electronic communication with one or more pads 104, 106, 108 disposed on a top surface of the die 100/over mold 102. Each pad 104, 106, 108 is connected to a top surface of the die 100 by corresponding vias 110, 112, 114.

In at least one embodiment, a top surface of the die 100 may be exposed (not covered by any over mold 102). In such embodiments, pads 104, 106, 108 may be in direct electronic communication with the die 100, without any intervening vias 110, 112, 114.

In at least one embodiment, the die 100 is in electronic communication with one or more pads 116 disposed on a bottom surface of the die 100/over mold 102. In at least one embodiment, the one or more pads 116 are connected to a bottom surface of the die 100 by corresponding vias. Alternatively, or additionally, the one or more pads 116 are connected to a bottom surface of the die 100 by an interposer 118. The interposer 118 includes top pads disposed to enable electronic connectivity with the die 100 at a top surface, and bottom pads disposed to engage solder joints or joints made with other conducting materials to create electronic connectivity with a host circuit board 120. Vias create electronic connectivity between the top pads and bottom pads within the interposer 118.

In at least one embodiment, a via 122 may connect a pad 124 on a top surface of the die 100/over mold 102 to the interposer 118 directly, without interfacing with the die 100.

Figure 2:
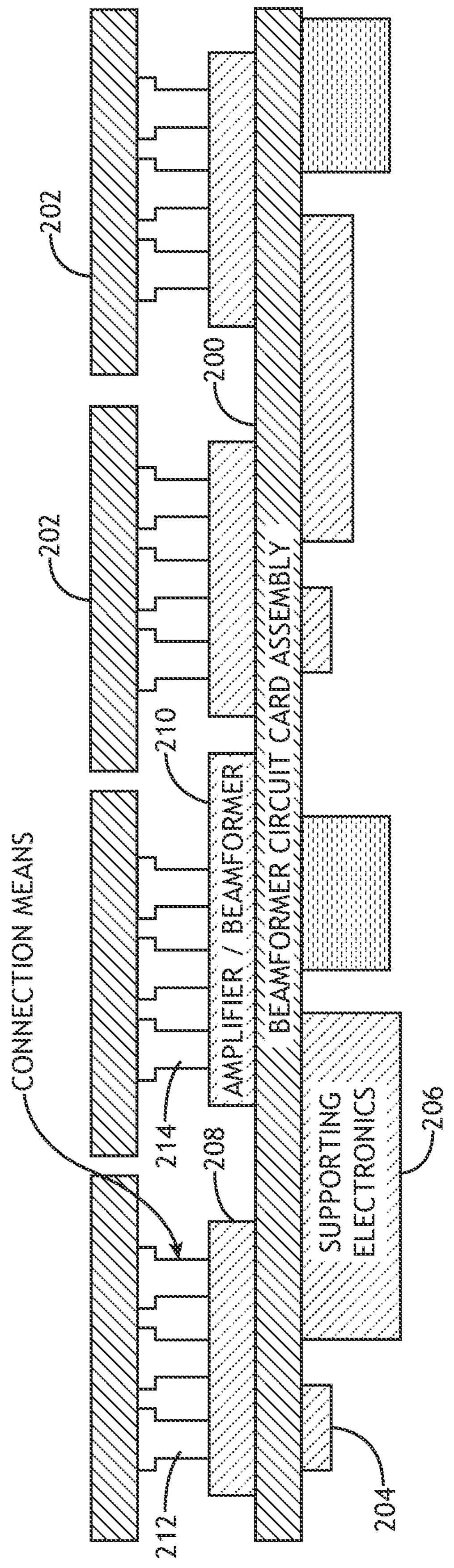
FIG. 2 shows a side view block diagram of a unit cell according to an exemplary embodiment.

Referring to FIG. 2, a side view block diagram of a unit cell according to an exemplary embodiment is shown. The unit cell includes separate cards 200, 202, individually configured as balanced stacks to obviate warping due to differences in thermal expansion. In at least one embodiment, the unit cell comprises a first card 200 including various electronic components 204, 206, 208, 210, and one or more second cards 202 including antenna structures. At least the first card 200 comprises pads on a top surface and pads on a bottom surface. The bottom surface of the first card may be open for required supporting components.

In at least one embodiment, the first card 200 defines a beamforming card including beamforming integrated circuit components 204, 206 and one or more amplifiers/beamformers 208, 210. In may be appreciated that the amplifiers/beamformers 208, 210 may be represented in more detail in FIG. 1; for example, the die 100 of FIG. 1 may at least partially embody the active circuitry of the amplifiers/beamformers 208, 210. In at least one embodiment, beamforming integrated circuit components 204, 206 may be disposed on a bottom surface of the first card 200, in electronic communication with pads on that bottom surface. Furthermore, in at least one embodiment, amplifiers/beamformers 208, 210 may be disposed on a top surface of the first card 200, proximal to the one or more second cards 202, in electronic communication with pads on that top surface.

The one or more second cards 202, including radiating structures, may include pads disposed on a bottom surface to allow electronic communication between the radiating structures and the beamforming components 208,210 when disposed above the first card 200; supporting electronics 204, 206 may be disposed on a bottom surface of the first card 200. In at least one embodiment, the first card 200 may be connected to the one or more second cards 202 via conductive elastomer pins 212, 214 disposed to engage the pads on the bottom surface of the one or more second cards 202 and pads on the top surface of the first card 200 (either directly or via the one or more amplifiers/beamformers 208, 210. Other connection types such as sponge-like cylindrical electrical interconnects, copper pillar, solder bumping or the like are envisioned.

Embodiments may utilize monolithic, waveguide, slot, helix, coil, microstrip patch radiating elements, or the like.

Embodiments of the present disclosure enable methods to shrink the size of the unit cell to allow higher frequency operation. Components are disposed vertically and connected through solder pads and/or vias to a die. Pads are disposed on both the top and the bottom side of the die for low inductance paths. Embodiments increase functional density to facilitate development of higher frequency antennas.

Radiating element may be disposed on a separate card and can be tuned/changed. Furthermore, while two cards have been illustrated and described, multiple separate cards are envisioned as necessary to create balanced stacks and reduce the impact of thermal expansion.

Separating the stack into smaller components facilitates fabrication via a Z-axis, additive fabrication processes. Such processes would otherwise be incompatible with existing fabrication processes. Furthermore, because materials with differing coefficients of thermal expansion can be separated, optimal dielectrics for specific applications can be used.

Embodiments of the present disclosure may be applicable to analog or digital electronic components in a vertical stack. Manufacturing processes may produce a smaller footprint, higher component density, higher yield, and lower HF interference.

Large packages are often difficult to solder; some pins may not make solder connections. Separating functional elements across cards with relatively balanced stacks for dielectric thickness may facilitate higher yielding interconnect operations due to lower warpage.

It is believed that the inventive concepts disclosed herein and many of their attendant advantages will be understood by the foregoing description of embodiments of the inventive concepts, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The forms herein before described being merely explanatory embodiments thereof, it is the intention of the following claims to encompass and include such changes. Furthermore, any of the features disclosed in relation to any of the individual embodiments may be incorporated into any other embodiment.

What is claimed is:

1. An electronic package comprising:

a first card comprising:

a die;

an over mold surrounding the die;

a plurality of top pads disposed on a top surface of the over mold, in electronic communication with the die; and a plurality of bottom pads in electronic communication with the die; and a second card comprising:

a plurality of bottom pads disposed on a bottom surface, wherein the second card is disposed above the first card such that the top pads of the first card are in electronic communication with the bottom pads of the second card, wherein the first card comprises a plurality of beamforming integrated circuits and the second card comprises a plurality of radiating elements.

2. The electronic package of claim 1, further comprising an interposer, wherein the die and over mold are disposed on a top surface of the interposer and the plurality of bottom pads are in electronic communication with the interposer.

3. The electronic package of claim 1, further comprising a plurality of amplifiers electronically interposed between the first card and the second card.

4. The electronic package of claim 1, wherein the first card and the second card comprise dielectric materials with different coefficients of thermal expansion.

5. The electronic package of claim 1, wherein the first card and the second card are connected via conductive elastomer pins.

6. The electronic package of claim 1, wherein the plurality of top pads is disposed directly on the die without intervening vias.

7. An antenna comprising:

a first card comprising:

a die;

an over mold surrounding the die;

a plurality of top pads disposed on a top surface of the over mold, in electronic communication with the die;

a plurality of bottom pads in electronic communication with the die;

a plurality of beamforming integrated circuit components disposed on a bottom surface of the first card in electronic communication with the plurality of bottom pads; and one or more amplifiers disposed on a top surface of the first card in electronic communication with the plurality of top pads; and a second card comprising:

a plurality of radiating elements;

a plurality of bottom pads disposed on a bottom surface, wherein the second card is disposed above the first card such that the top pads of the first card are in electronic communication with the bottom pads of the second card.

8. The antenna of claim 7, wherein the first card further comprises an interposer, wherein the die and over mold are disposed on a top surface of the interposer and the plurality of bottom pads are in electronic communication with the interposer.

9. The antenna of claim 8, wherein the plurality of amplifiers is electronically interposed between the beamforming integrated circuit components and the plurality of radiating elements.

10. The antenna of claim 7, wherein the first card and the second card comprise dielectric materials with different coefficients of thermal expansion.

11. A system comprising:

a first card comprising:

a die;

an over mold surrounding the die;

a plurality of top pads disposed on a top surface of the over mold, in electronic communication with the die; and a plurality of bottom pads in electronic communication with the die; and a second card comprising:

a plurality of bottom pads disposed on a bottom surface, wherein the second card is disposed above the first card such that the top pads of the first card are in electronic communication with the bottom pads of the second card, wherein the first card comprises a plurality of beamforming integrated circuits and the second card comprises a plurality of radiating elements.

12. The system of claim 11, further comprising an interposer, wherein the die and over mold are disposed on a top surface of the interposer and the plurality of bottom pads are in electronic communication with the interposer.

13. The system of claim 11, further comprising a plurality of amplifiers electronically interposed between the first card and the second card.

14. The system of claim 11, wherein the first card and the second card comprise dielectric materials with different coefficients of thermal expansion.

15. The system of claim 11, wherein the first card and the second card are connected via conductive elastomer pins.

16. The system of claim 11, wherein the plurality of top pads is disposed directly on the die without intervening vias.

* * * * *